United States Patent [19]

Abe et al.

[11] Patent Number: 5,352,490

[45] Date of Patent: * Oct. 4, 1994

[54] METHOD OF CHEMICAL VAPOR DEPOSITION IN A CONTINUOUS TREATMENT LINE

[75] Inventors: Masahiro Abe; Kazuhisa Okada; Shuzo Fukuda, all of Tokyo, Japan

[73] Assignee: NKK Corporation, Tokyo, Japan

[*] Notice: The portion of the term of this patent subsequent to Feb. 18, 2009 has been disclaimed.

[21] Appl. No.: 910,827

[22] Filed: Jul. 6, 1992

Related U.S. Application Data

[63] Continuation-in-part of Ser. No. 247,741, Sep. 22, 1988, abandoned.

[51] Int. Cl.$^5$ ............................................. C23C 16/00
[52] U.S. Cl. ................................. 427/251; 427/255.1; 427/255.2; 427/255.5; 148/110; 148/111; 148/113
[58] Field of Search ..................... 427/209, 251, 255.5, 427/255.1, 255.2; 148/110, 111, 113; 118/718

[56] References Cited

U.S. PATENT DOCUMENTS

| | | | |
|---|---|---|---|
| 3,423,253 | 1/1969 | Ames et al. | 148/113 |
| 3,730,783 | 5/1973 | Streel | 427/251 |
| 5,089,061 | 2/1992 | Abe et al. | 148/113 |

Primary Examiner—Shrive Beck
Assistant Examiner—David M. Maiorana
Attorney, Agent, or Firm—Nields & Lemack

[57] ABSTRACT

A reaction gas or a gas containing a reaction gas is blown through blowing nozzles onto a steel material in a chemical vapor deposition treating chamber at a velocity sufficient to forcibly remove reacted products from reacted surfaces of a steel material while suppressing irregular thickness of a deposited film.

7 Claims, 9 Drawing Sheets

Molecular weight / Density
SiCl₄: 170   7.58kg/Nm³
FeCl₂: 127   5.66kg/Nm³

FIG.12

METHOD OF CHEMICAL VAPOR DEPOSITION IN A CONTINUOUS TREATMENT LINE

This application is a continuation-in-part of application Ser. No. 07/247,741 filed Sep. 22, 1988, now abandoned.

FIELD OF THE INVENTION

The present invention relates to a method of carrying out chemical vapor deposition of metal, ceramics and other coatings upon steel material in a continuous treatment line.

BACKGROUND OF THE INVENTION

Chemical vapor deposition (hereinafter referred to as "CVD") is known as a method of coating metals or ceramics upon the material to be processed. In CVD, a gaseous composition (e.g. reaction gas+carrier gas or the like) is supplied to a heated material to be processed and causes the reaction gas to contact surfaces thereof and precipitate thereon contents in the gaseous composition by chemical reactions. CVD has broadly been employed, since it allows various kinds of coatings and materials to be processed and has a lot of excellent merits such as good adhesion property.

However, CVD has had problems that the depositing speed is low, and so it takes much time for treatment. Therefore, if it were applied to a continuous line such as a continuous treatment line of a steel strip, any treating furnace would be considerably lengthened. Further in the CVD method, the deposited film easily becomes irregular in thickness, and this is especially noticeable in continuous treatment lines. Thus, it has been actually difficult to apply CVD to continuous treatment lines.

The inventors have made studies of the depositing speed and the irregular thickness of the deposited film in the case of conventional CVD treatments. As a result, they have found that those problems were closely related to the fluidity of the gas in the vicinity of the reacting surface of the material being treated. The prior art taught that, if the gas composition in CVD were made to flow rapidly, depositing irregularities would be caused, air bubbles would be formed in or mixed into the deposited film, further purity of the deposited film would be lowered, and accordingly, the gas fluidity had to be controlled to a necessary minimum. However, it was found through the inventors' studies that, as a result of suppressing the flowing of the gas to avoid the aforementioned problems, different problems arose: namely, diffusion of the reaction gas to the surface of the material being processed could not be made smooth, and a separation of reacted by-product (gas produced by reaction) from the surface larger thereof could not be made smooth, so that it took much time for the treatment; moreover the concentration of the reaction gas within the treating chamber was effected with non-uniform distributions, and consequently the deposited film was made irregular in thickness.

In view of these problems, it is an object of the invention to provide a method for performing the CVD treatment on the steel material in the continuous line without making the line lengthened or causing the deposited film to be irregular in thickness.

Having made further studies on the above mentioned problems, the inventors found that, if a reaction gas or a gas containing a reaction gas were blown to the steel material through blowing nozzles in the CVD treating chamber, the treatment could be accomplished at the high depositing speed, while suppressing the irregular thickness of the deposited film.

SUMMARY OF THE INVENTION

In this invention, a reaction gas or a gas containing a reaction gas is blown through blowing nozzles onto the steel material in a chemical vapor depostition treating chamber, thereby forcibly removing reacted products from treated surfaces of the steel material, and concurrently carrying out the chemical vapor deposition on the steel material. Thus, it is possible to form a desired deposition film on the steel material at high depositing speed, while suppressing irregularities in thickness of the deposited film. In general, the gaseous composition containing said gas is applied toward the steel material from the blowing nozzles at a gas discharging speed (the speed at the nozzle outlet) of not less than 0.5 m/s, and is blown onto the steel surfaces at a flowing speed (the speed when the gas strikes the steel material) of not higher than 5 Nm/sec.

For accomplishing the aforementioned object of the invention in the CVD incorporated in the continuous treatment line for coating the steel material by passing it through the CVD treating chamber, the invention blows the reaction gas or the gas containing the reaction gas to the steel material by the blowing nozzles at a velocity sufficient to forcibly remove reacted products from the reacted surface to the steel material, and concurrently carrying out the chemical vapor deposition on the steel material. Thus, it is possible to form a desired deposition film on the steel material at high speed, while controlling irregular thickness of the film. In general, the gas is discharged from the blowing nozzles at a discharging speed (=the speed at the nozzle outlet) of not less than 0.5 m/sec and is blown onto the steel surfaces at a flowing speed (the flow speed when the gas strikes the steel material) of not higher than 5 Nm/sec.

According to the invention, for example, the gas composition contains $SiCl_4$ as the reaction gas, and if the steel plate is treated with this gas, Si can be coated on the steel uniformly and efficiently.

BRIEF DESCRIPTION OF THE DRAWINGS

In FIGS. 1, 2(a) and 2(b), 1 is a heating furnace, 2 is a CVD treating furnace, 3 are blowing nozzles, and S is a steel strip. In FIG. 8, 5 are blowing nozzles.

DETAILED DESCRIPTION OF PREFERRED EMBODIMENTS

The present invention will be explained in detail.

With respect to main reactions taking place on the surfaces of the steel material in the CVD treatment, when, for example, $SiCl_4$ is used as the reaction gas for coating Si thereon, the main reaction is When $TiCl_4$ is used as the reaction gas, and Ti is coated, the main reactions are In these depositing reactions, it is very important for accelerating the reaction to supply successively the reaction gas or the gas containing the reaction gas onto the steel material at the surfaces thereof, and instantly separate the reaction generated gases ($FeCl_2$, HCl, etc.) from the reacting surfaces.

Figure 7:
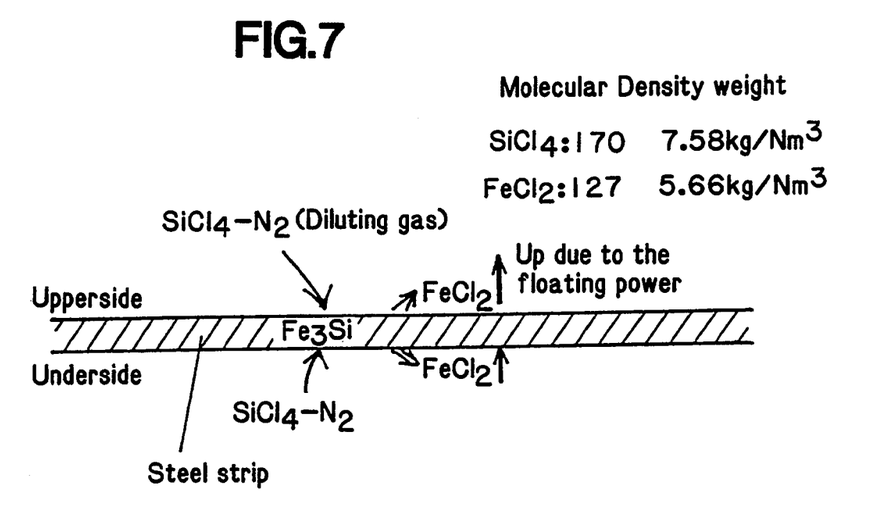
FIG. 7 schematically shows reactions of the steel strip and $SiCl_4$.

FIG. 7 schematically shows the reaction between the steel strip and $SiCl_4$. At the upper surface of the steel strip, since $FeCl_2$ naturally goes away from the steel strip due to its floating power based on difference in density between $FeCl_2$ (by-product of reaction) and $SiCl_4$, striking of $SiCl_4$ against the steel strip smoothly takes place. However, at the under surface of the steel strip, since $FeCl_2$ is pressed thereagainst by its floating power as said above, it does not release smoothly therefrom, and accordingly the reaction as said above does not take place smoothly. Further since the difference in density between $FeCl_2$ and $SiCl_4$ is 5.66/7.58=0.75, a sufficient floating power of $FeCl_2$ is difficult to be effected even on the upper surface of the steel strip.

In this regard, the present invention positively blows the gas to the surfaces of the steel material through the blowing nozzles so as to accelerate the supply of the reaction gas to the reacting surfaces and the separation of the gas generated by the reaction therefrom, so that consequently the depositing reaction is accelerated, and a large treating speed may be provided.

On the other hand, by blowing the gas to the steel material, a fresh reacting gas of constant concentration is always supplied to the reaction surfaces, thereby to solve the problem about irregular thickness of the deposited film by the non-uniform distribution in concentration of the reacting gas.

Figure 8:
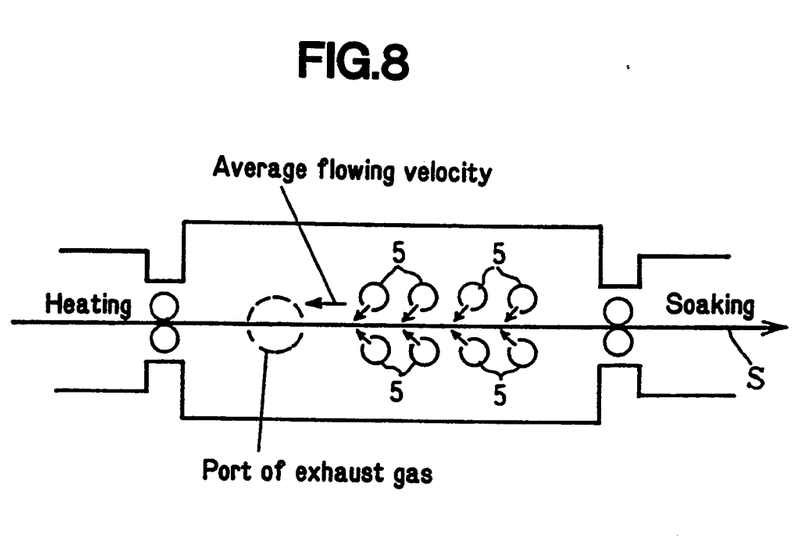
FIG. 8 is an explanatory view showing gas flowing directions within the furnace.

For exactly obtaining effects as above mentioned by the gas blowing from the nozzle, the flowing of the gas discharging from the nozzle should not be disturbed by gas flowings (which go toward a gas discharging port after having collided against the steel strip) within the surface as shown in FIG. 8.

Figure 10:
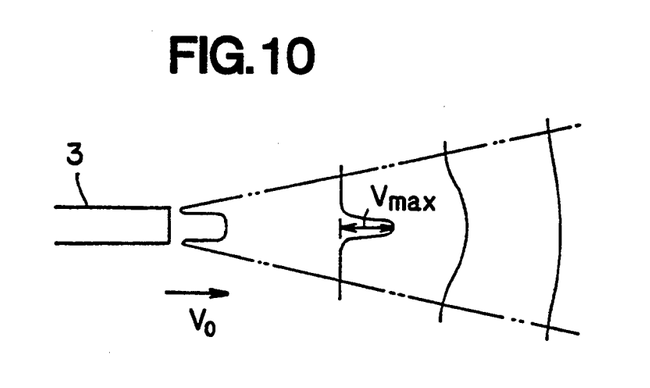
FIG. 10 shows a flowing distribution of the gas discharged from the nozzle.
Figure 11A:
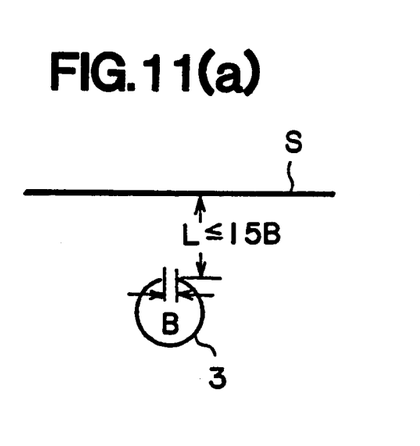
FIG. 11(a) and 11(b) show relations between the distance (L) from the gas discharging portion of the blowing nozzle to the steel strip and the nozzle diameter (B)
Figure 11B:
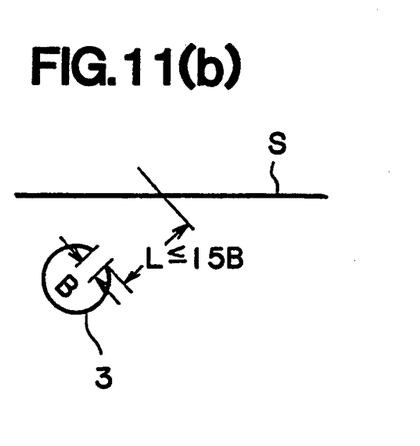
Figure 12:
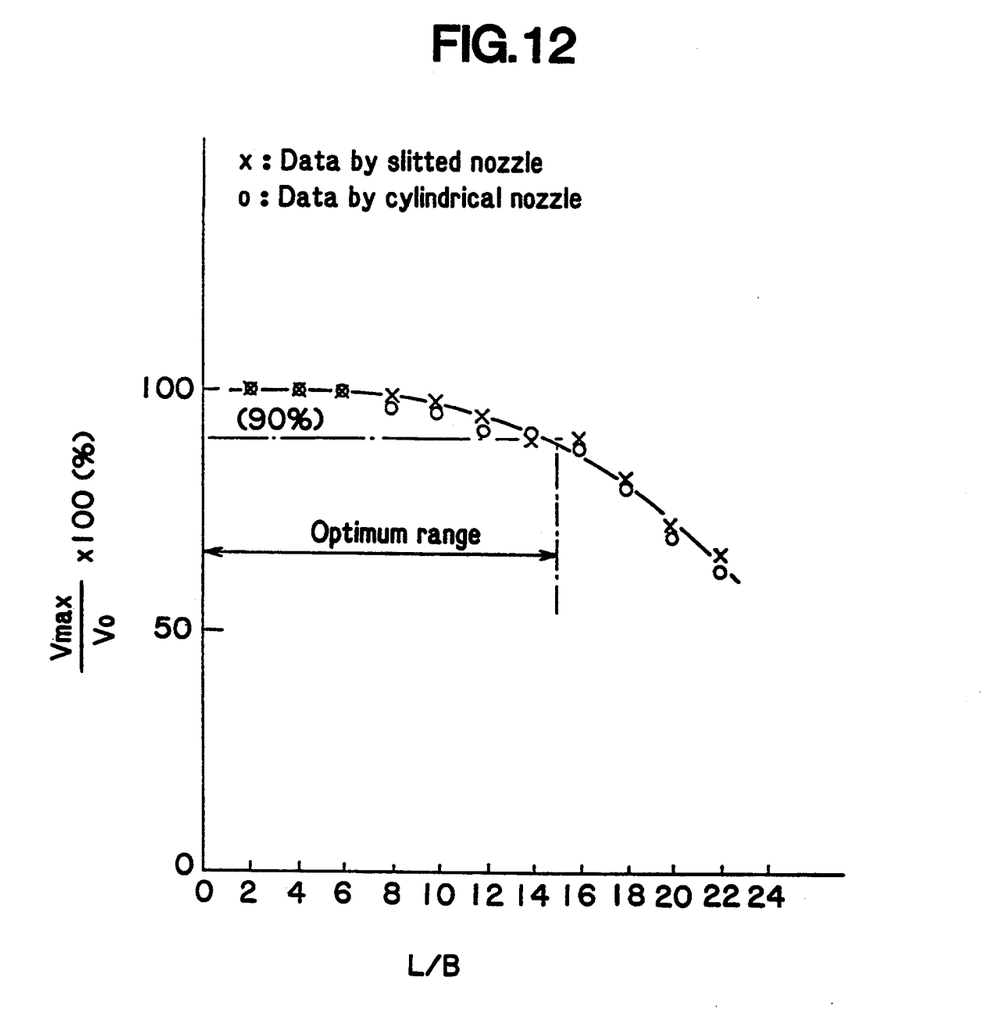
FIG. 12 is a graph showing the influence of ratios (L/B) of distances (L) between the gas discharging portion of the nozzle and the steel strip to the nozzle diameter (B), giving upon ratios (Vmax/Vo) of a maximum gas flow velocity Vmax of the gas dischared from the nozzle to the gas discharging velocity Vo from the nozzles.

As seen in FIG. 10, in general a maximum flow velocity Vmax of the gas discharged from the nozzle at a discharging velocity Vo becomes gradually decreased, since said gas involves fluids thereabout. In this regard, a range from the gas discharging portion of the nozzle until a distance of [the nozzle diameter (or a slit width of the slitted nozzle)×5−15] in the gas discharging direction is called a potential core range, and in this potential core range, a relation to an extent of about Vmax≈Vo×0.9 is maintained. FIG. 12 shows such relations. Assuming that the distance from the gas discharging portion of the nozzle to the steel strip is L, and the nozzle diameter or the slit width is B, and if L/B≦15, it is seen that the maximum velocity Vmax is about not less than 90% of the gas discharging velocity Vo. In the present invention, it is not preferable to invlove a circumferential gas into the discharged gas flow, since it causes disturbance elements, and it is necessary to secure at least about Vmax=Vo×0.9. Therefore, as shown in FIG. 11 (a) and (b), it is preferable to specify the distance (L) from the gas discharging portion of the blowing nozzle 3 to the running steel strip S being treated to be not larger than 15 times of the nozzle diameter B (or the slit width).

The average flowing velocity U (Bulk flow) within the furnace is generally 0.01 to 0.2 m/s. According to the inventors' experiments, in the case of L/B≦15 as stated above, in order that the flowing gas discharged from the nozzle is not disturbed by the flowing gas (Bulk flow) within the furnace, they have found it preferable that the following relation should be satisfied by the gas discharging velocity Vo (m/sec) from the nozzle and the average gas flowing velocity U (m/sec) within the furnace:

$$Vo \geq 2.5 \times U$$

Figure 9:
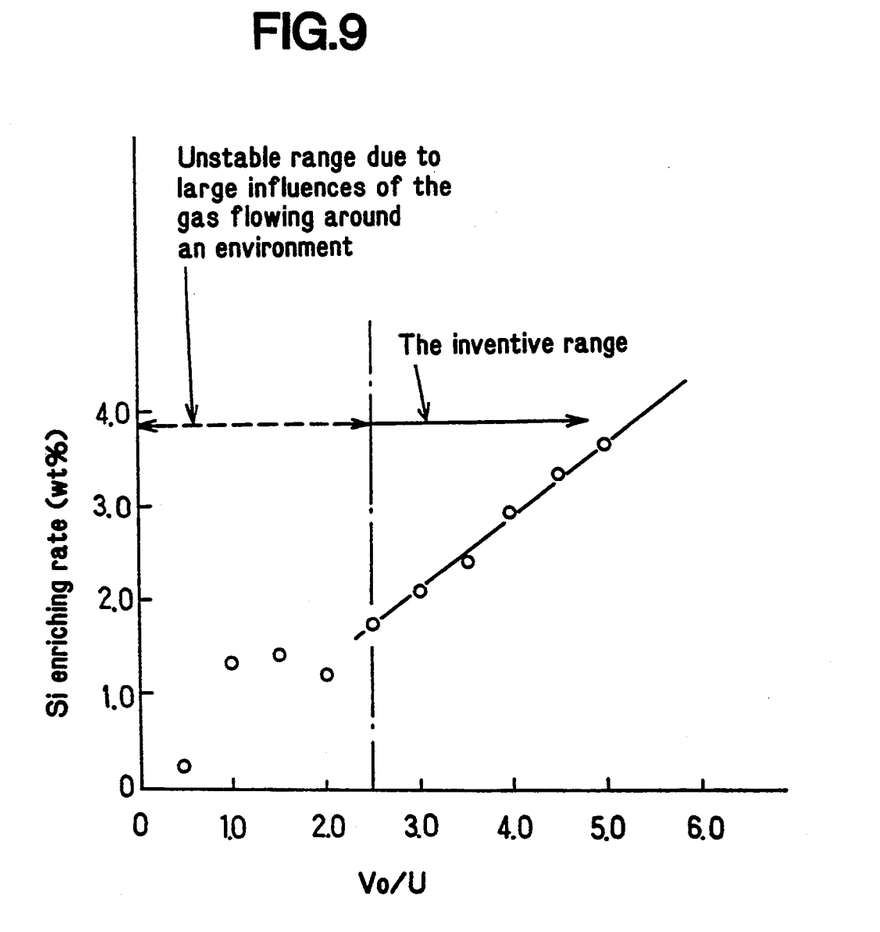
FIG. 9 is a graph showing the influence upon Si enriching rate given by the ratio (Vo/U) of the gas discharging velocity Vo from the nozzles to the average gas flowing velocity U within the furnace.

FIG. 9 shows the relation between Vo/U and the Si enriching rate. In this experiment, the gas containing $SiCl_4$ (the reaction gas) was blown from the nozzles to the steel plate (3% Si steel plate of 0.3 mm thickness) being moved in the continuous line so as to enrich Si in the steel plate. The CVD treating conditions therefor are as follows.

Line speed: 2 mpm

Treating condition: 1150° C., and 1 atmospheric pressure

Average bulk flowing speed: 0.1 m/sec (=0.02 Nm/sec)

Blowing gas: $SiCl_4$ (15%)+$N_2$ (85%)

Gas blowing condition from the nozzle: The gas discharging velocity Vo from the nozzle was changed by varying the total flowing amount of the gas.

According to FIG. 9, it is seen that if Vo/U is less than 2.5, the flowing of the gas from the nozzle is disturbed by the gas flowing within the furnace, and Si is not stably enriched. Accordingly, taking the maximum value of said U into consideration, it is preferred that the gas discharging speed from the nozzle is determined to be not lower than 0.5 m/s, whereby the gas flowing from the nozzle collides against the steel strip without disturbance by the gas flowing within the furnace, and $FeCl_2$ is exactly removed from the surfaces of the mother material.

Figure 1:
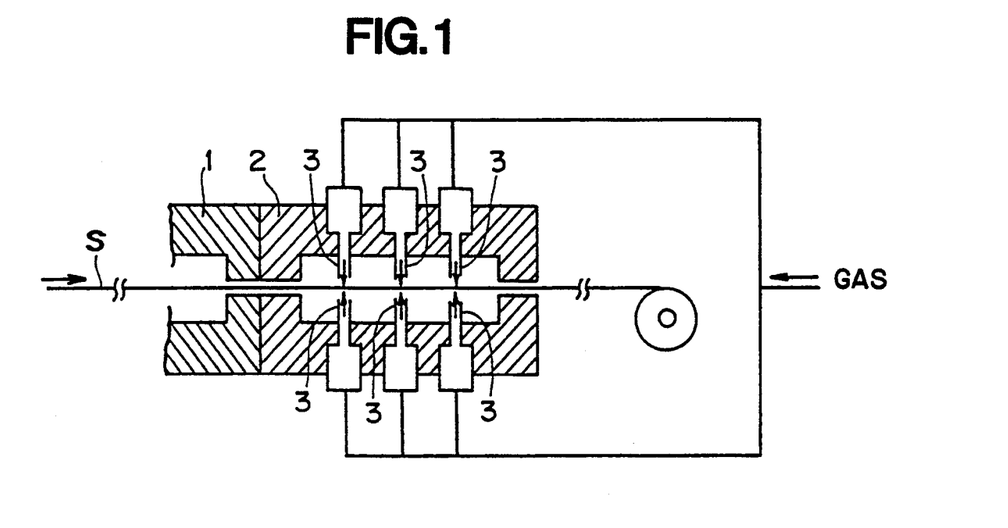
FIG. 1 is an explanatory view showing one embodiment of the invention.

FIG. 1 shows that the present invention is applied to the CVD continuous treatment of the steel strip S, where the reference numeral 1 designates a heating furnace, 2 is the CVD treating furnace, and 3 is the blowing nozzles disposed within the CVD treating furnace.

The steel strip S is heated up to a CVD treating temperature or an ambient temperature in the heating furnace 1 and consecutively is introduced into the CVD treating furnace 2 where the reaction gas or the gas containing the reaction gas is blown onto the steel strip at the both surfaces thereof from the blowing nozzles 3.

Figure 3:
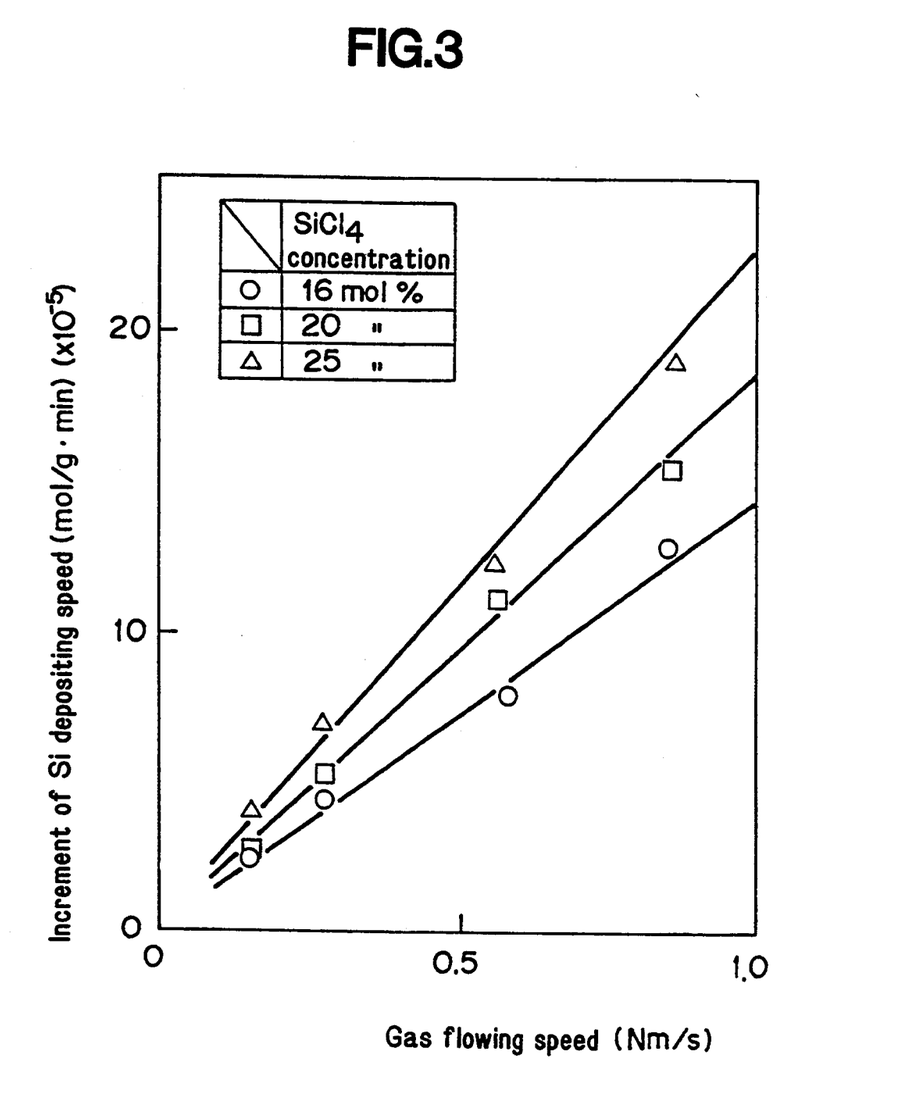
FIG. 3 is a graph showing the influence of the gas flowing speed upon Si deposition speed in the present invention.

FIG. 3 shows the relation between the flowing speed (the speed when striking the steel strip) of the gas ($SiCl_4$+carrier gas) and the Si depositing speed, when the Si depositing treatment is carried out in the above mentioned continuous line. "Increment of Si depositing speed" in FIG. 3 shows the difference between the Si depositing speed by the nozzle blowing and the Si depositing speed by no nozzle blowing. The Si depositing speed herein means a deposition amount (mol) of Si per 1 g of the mother material in unit time (1 min) material. As is seen from the same, the Si depositing speed is remarkably increased by blowing the gas through the nozzles. The Si deposition speed is increased in proportion to the increasing of the striking flowing speed to the surface of the steel strip, however, even if the flowing speed is exceedingly heightened, and since there exists a limitation about the reaction speed on the steel surface, the Si deposition speed in response to the heightening of the flowing speed cannot be effected, and accordingly a more Si enriching effect cannot be expected. In general, the satisfied effect (i.e. the satisfied Si deposition speed) can be obtained at the flowing speed of not higher than 5 Nm/sec.

Figure 2A:
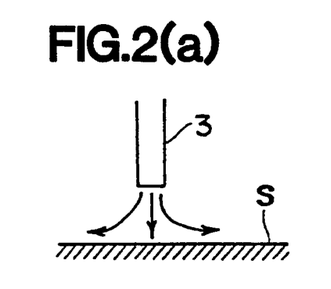
FIGS. 2(a) and 2(b) are explanatory views showing blowing methods by the blowing nozzles, respectively.
Figure 2B:
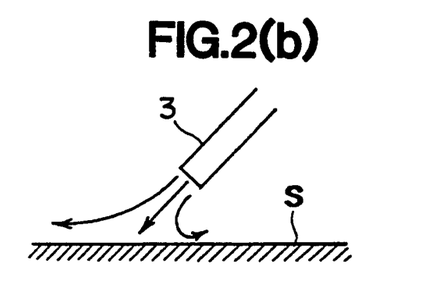

FIGS. 2 (a) and (b) show the blowing methods by the blowing nozzles 3 and the gas may be blown to the steel surface in a vertical direction as shown in (a) or an oblique direction as in (b).

The present invention may be applied to the continuous CVD treatment of not only coiled steel bands but also non-continuous steel plates to be processed, and in this case such plates are continuously moved by belts or the like, and the CVD treatment is performed during moving.

According to the invention, it is possible to accelerate the diffusion reaction of the reaction gas to the surfaces of the steel material and the separation therefrom, so that the deposition may be effected at high speed. In addition, since the fresh reaction gas of constant concentration is always supplied to the reacting surfaces, it is possible to efficiently produce CVD treated materials of good quality in a short continuous line.

The present invention as stated hereinbefore may be applied to various CVD treatments. In the CVD treatment, the steel material is caused to directly react a main gas containing vapor depositing elements with the steel material, or react the main gas and an auxiliary gas (such as $CH_4$, $H_4$, $CO_2$ and others) so as to form a coating of a desired compound on the surfaces of the steel material. Therefore, in the former case, the main gas is the reaction gas, and in the latter case, the main gas and the auxiliary gas are the reaction gases. For the CVD treatment, the main gas and the auxiliary gas are selected in response to desired vapor deposited film.

For example, when Si is deposited, $SiCl_4$, $Si_2Cl_6$, or $SiH_4$ may be assumed as the main gas. In this case, the auxiliary gas is not required, but a diluting gas (such as $N_2$, Ar and others) called a carrier gas is used for controlling reaction speed.

The reaction formulas thereof are as follows.

When the coatings of Ti compounds are formed on the surface of the steel, the reaction formulas are as follows.

Herein,
(a): main gas, (b): carrier gas, (c): steel plate, (d): surface layers of the steel plate, (e): product by reaction, (f): heat decomposition (g): precipitation on the steel surfaces, (h): auxiliary gas The objective CVD treatment of this invention includes the vapor depositions of Si, Cr or Al, and the vapor depositions of compounds or elements such as $Al_2O_3$, $Cr_7C_3$, $TiB_2$, TiC, TiN, W, Mo, $W_2C$, or ZrC. Accordingly, the gases to be employed in this invention may be considered to be as follows:

Main gases: $AlCl_3$, $BCl_2$, $CrCl_2$, $SiCl_4$, $Si_2Cl_6$, $SiH_4$, $WCl_2$, ZrCl, $TiCl_4$ Auxiliary gases: $CH_4$, $H_2$, $N_2$, $CO_2$, $H_2O$ Carrier gases: $N_2$, At, He It is possible to practise the diffusion heating treatment for diffusing the deposited materials into the interior of the steel material after the above stated CVD treatment.

For example, in the chemical vapor depositing chamber, a plurality of blowing nozzles are disposed along both sides of the steel strip running line, and the gas containing $SiCl_4$ as the reacting gas is blown from the blowing nozzles onto the running steel strip at both surfaces thereof, thereby to deposit Si on the steel strip. Subsequently, by the diffusion heating treatment on the steel strip and the diffusion of the Si deposited on the steel surface into the interior of the steel, the high silicon steel strip may be produced.

EXAMPLE

Figure 4:
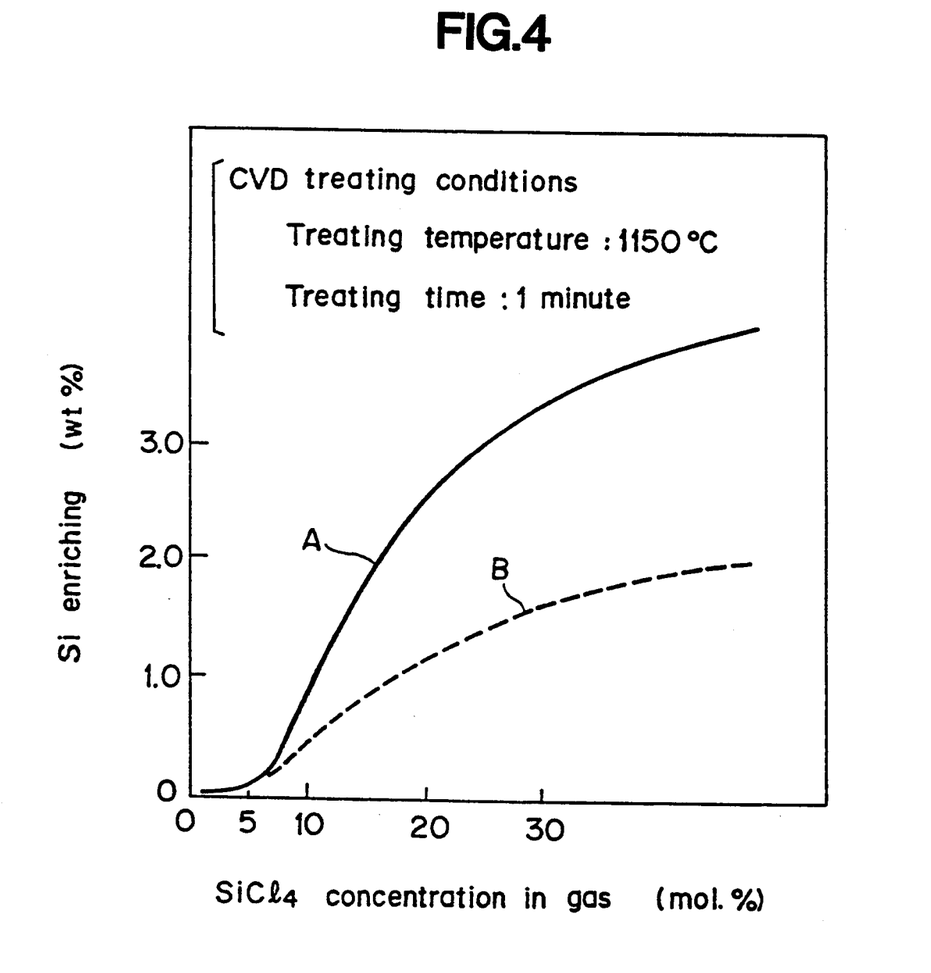
FIG. 4 is a graph showing the influence of $SiCl_4$ concentration in the gas upon the enriching rate of Si in steel strip in the inventive method and the comparative method.
Figure 5:
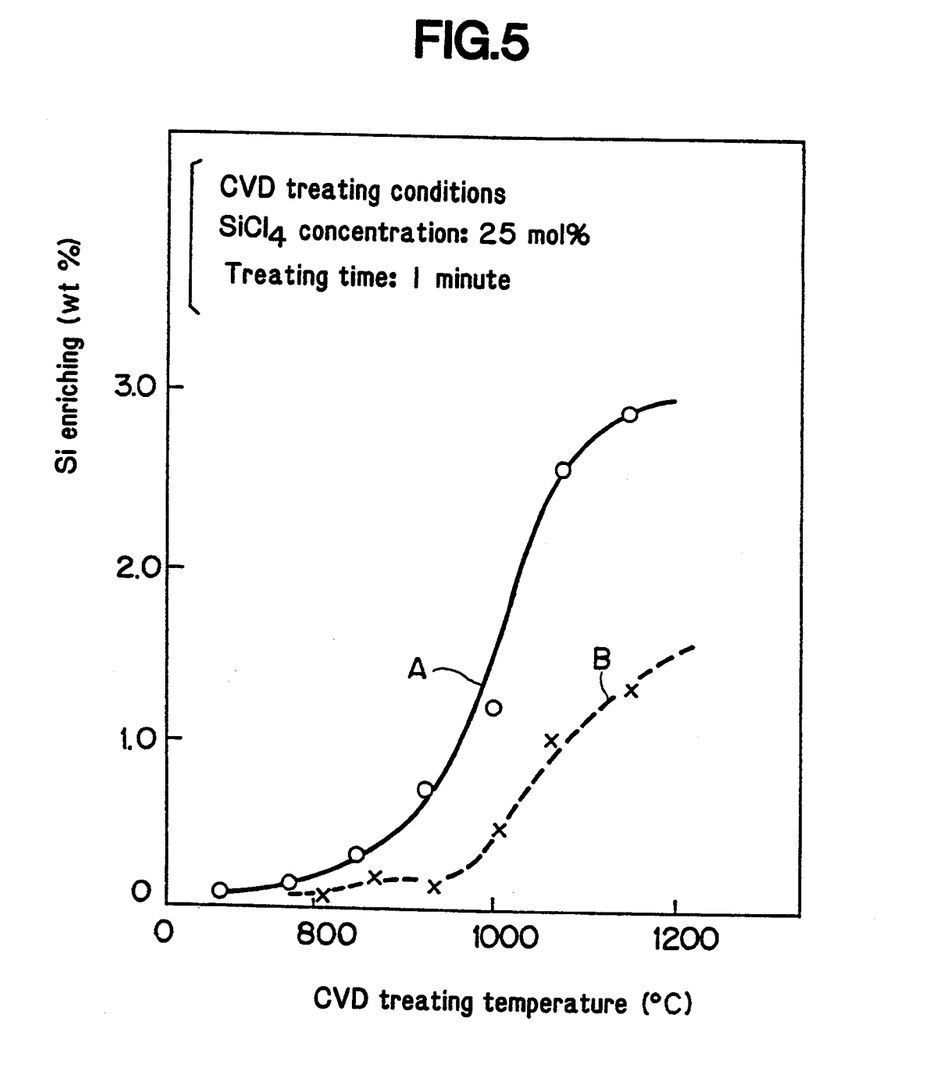
FIG. 5 is a graph showing the influence of the CVD treating temperatures upon the enriching rate of Si in the steel strip in the inventive method and the comparative method.

Two runs were made: a first run (A) using the inventive method (the gas discharging speed from the nozzle: not less than 0.5 m/s) and a second run (B) using the comparative method (the method of carrying out the CVD treatment without using the nozzle blowing). In both cases a CVD treating furnace of the small size was used in conjunction with a diffusion treating furnace, high silicon steel strips were produced by subjecting cooled steel strips of ordinary chemical compositions to the CVD treatment (the treating temperature of 1150° C. and 1 atmospheric pressure) for the Si deposition, followed by the diffusion heating treatment. FIG. 4 shows relations between the SiCl$_4$ concentration in the gas blown onto the steel strips and the Si enriching rate in the steel strips, and FIG. 5 shows relations between the CVD treating temperature and the Si enriching rate in the steel strips. In the drawings, "A" designates the inventive method (the gas colliding speed against the steel surface of 0.5 m/s=0.1 Nm/s), and "B" designates the comparative method. The Si enriching rate in wt % is equal to the concentration of Si after the combined CVD treatment and diffusion heating treatment minus the original Si concentration in the mother material, divided by said original concentration and multiplied by 100.

Figure 6:
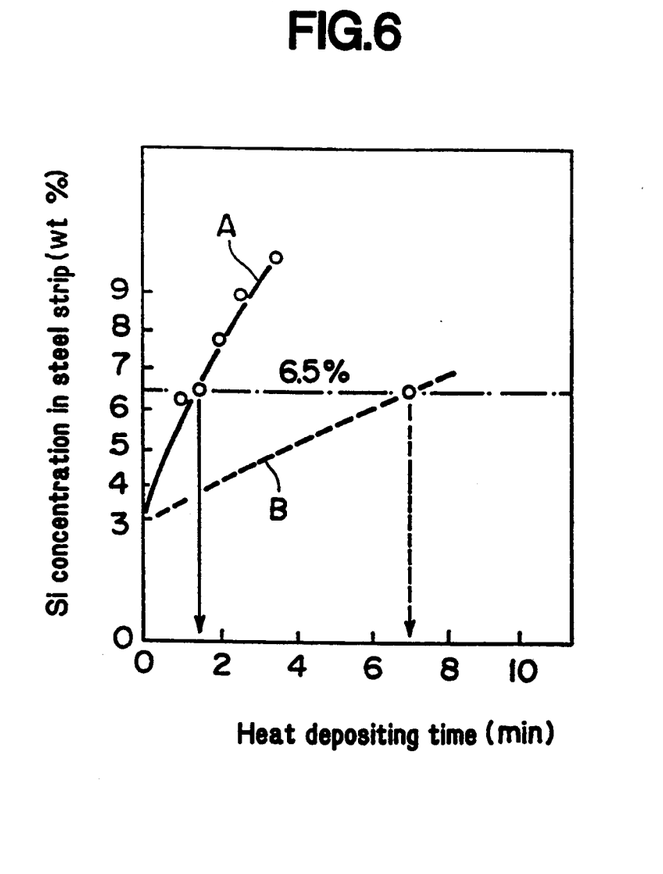
FIG. 6 is a graph showing the influence of depositing time upon Si concentration in the steel strip in the inventive method and the comparative method.

As is seen from these drawings, the inventive method carried out the nozzle blowings, whereby the Si enriching effect (=depositing speed) was far excellent in comparison with the comparative method which merely passed the steel strip in the gas including the reaction gas. FIG. 6 shows relations between the depositing time and the Si concentration in the steel strips (the Si concentration after the diffusion treatment) of the inventive method A and the comparative method B by using the same combination of CVD treating furnace and diffusion treating furnace under the conditions of Si: 3%, thickness: 0.5 mm, SiCl$_4$: 21% concentration, and treating temperature: 1150° C. In the inventive method, the gas was blown to the steel strip at the blowing speed of 0.2 Nm/sec through slitted nozzles in the vertical direction. As is seen from the same, for producing 6.5% Si steels, the comparative method B took 7 minutes, while the inventive method could treat in 1.5 minutes.

With respect to the aforementioned units expressing the flowing rate, "m/sec" is ordinarily used for showing actual flowing rate, and "Nm/sec" is a unit for showing the flowing rate under a standard condition at 0° C. and 1 atmospheric pressure. For example, in the case of the treating temperature of 1150° C. under the 1 atmospheric pressure as seen in the EXAMPLE of this specification, the relation between the two will be as follows:

Actual flowing rate
(m/sec)=[(1150+273)/273]×(Nm/sec).

The term "reaction gas" means a gas to be reacted with Fe or other gases for depositing an objective material onto a steel material.

What is claimed is:

1. A method of chemical vapor deposition in a continuous treatment line for coating the surface of a steel material having a surface by passing it through a chemical vapor deposition treating chamber, comprising blowing a reacting as or a gas containing a reacting gas onto the steel material through blowing nozzles in the chemical vapor deposition treating chamber so as to cause chemical vapor deposition on said surface at a velocity sufficient to forcibly remove products of the reaction caused by said reacting gas from said surface of the steel material, and concurrently carrying out chemical vapor deposition thereon, including blowing the gas onto the steel material from the blowing nozzles at discharging speed $V_o$ of not less than 0.5 m/sec.

2. The method as claimed in claim 1, comprising blowing the gas onto the steel material at the flowing speed of not higher than 5 Nm/sec.

3. The method as claimed in claim 1 or 2, comprising blowing onto the steel material the gas as a mixed gas of not less than one kind of the following main gases, and not less than one kind of the following auxiliary gases or/and the following carrier gases Main gases: AlCl$_3$, BCl$_2$, CrCl$_2$, SiCl$_4$, Si$_2$Cl$_6$, SiH$_4$, WCl$_2$, ZrCl, TiCl$_4$
Auxiliary gases: CH$_4$, H$_2$, N$_2$, CO$_2$, H$_2$O
Carrier gases: N$_2$, Ar, He.

4. The method as claimed in claim 1 or 2, wherein said blowing nozzles include a plurality of blowing nozzles disposed along both sides of a transferring line of the steel material within the chemical vapor deposition treating chamber, and wherein said method comprising blowing the gas onto the running steel strip at both surfaces thereof through the blowing nozzles.

5. The method as claimed in claim 1 or 2, comprising blowing the gas from the blowing nozzles onto the steel material as a non-continuous steel material transferred by means of a transferring means.

6. The method as claimed in claim 1 or 2, comprising including SiCl$_4$ in the reacting gas which is blown onto the steel material so as to form a coating of Si thereon.

7. The method as claimed in claim 1 or 2, wherein said blowing nozzles include a plurality of blowing nozzles disposed along both sides of a transferring line of the steel material within the chemical vapor deposition treating chamber, and including SiCl$_4$ in the reaction gas which is blown onto the steel material at both surfaces thereof through the blowing nozzles, and carrying out a diffusion heating treatment on the steel material so as to diffuse Si thus deposited on the steel surfaces into the interior of the steel.

* * * * *